(12) United States Patent
Hu et al.

(10) Patent No.: US 9,761,551 B2
(45) Date of Patent: Sep. 12, 2017

(54) SOLDER JOINT STRUCTURE FOR BALL GRID ARRAY IN WAFER LEVEL PACKAGE

(71) Applicant: Taiwan Semiconductor Manufacturing Company, Ltd., Hsin-Chu (TW)

(72) Inventors: Yu-Hsiang Hu, Hsin-Chu (TW); Wei-Yu Chen, Taipei (TW); Wei-Hung Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/044,032

(22) Filed: Feb. 15, 2016

(65) Prior Publication Data

US 2016/0181219 A1   Jun. 23, 2016

Related U.S. Application Data

(62) Division of application No. 14/096,953, filed on Dec. 4, 2013, now Pat. No. 9,449,934.

(51) Int. Cl.
*H01L 23/00*   (2006.01)
*H01L 23/31*   (2006.01)
*H01L 21/56*   (2006.01)

(52) U.S. Cl.
CPC ............. *H01L 24/17* (2013.01); *H01L 21/56* (2013.01); *H01L 23/3114* (2013.01); *H01L 23/3142* (2013.01); *H01L 23/3171* (2013.01); *H01L 24/11* (2013.01); *H01L 24/81* (2013.01); *H01L 2224/03462* (2013.01); *H01L 2224/05008* (2013.01); *H01L 2224/05155* (2013.01); *H01L 2224/05166* (2013.01); *H01L 2224/05568* (2013.01); *H01L 2224/05569* (2013.01); *H01L 2224/05573* (2013.01);
(Continued)

(58) Field of Classification Search
CPC ... H01L 23/28; H01L 23/544; H01L 23/3171; H01L 23/49816; H01L 24/11; H01L 24/14; H01L 23/3128; H01L 24/73
USPC ........ 257/737, 738, 741, 769; 438/113, 460, 438/613
See application file for complete search history.

(56) References Cited

U.S. PATENT DOCUMENTS 6,286,207 B1 * 9/2001 Oura ................... C23C 18/1608
                                                      205/126
7,642,128 B1   1/2010 Lin et al.
(Continued)

*Primary Examiner* — Evan Pert
*Assistant Examiner* — Changhyun Yi
(74) *Attorney, Agent, or Firm* — Slater Matsil, LLP

(57) ABSTRACT

A semiconductor device package and a method for forming the same using an improved solder joint structure are disclosure. The package includes solder joints having a thinner bottom portion than a top portion. The bottom portion is surrounded by a molding compound and the top portion is not surrounded by a molding compound. The method includes depositing and forming a liquid molding compound around an intermediate solder joint using release film, and then etching the molding compound to a reduced height. The resulting solder joint has no waist at the interface of the molding compound and the solder joint. The molding compound has a greater roughness after the etch, greater than about 3 microns, than the molding compound as formed.

20 Claims, 5 Drawing Sheets

(52) U.S. Cl.
CPC ............... *H01L 2224/05655* (2013.01); *H01L 2224/05664* (2013.01); *H01L 2224/05666* (2013.01); *H01L 2224/05681* (2013.01); *H01L 2224/1181* (2013.01); *H01L 2224/1191* (2013.01); *H01L 2224/11334* (2013.01); *H01L 2224/11849* (2013.01); *H01L 2224/13005* (2013.01); *H01L 2224/13111* (2013.01); *H01L 2224/16057* (2013.01); *H01L 2224/16227* (2013.01); *H01L 2224/16238* (2013.01); *H01L 2224/73204* (2013.01); *H01L 2224/81191* (2013.01); *H01L 2224/81815* (2013.01); *H01L 2224/83104* (2013.01); *H01L 2224/83365* (2013.01); *H01L 2224/92125* (2013.01); *H01L 2224/94* (2013.01); *H01L 2924/181* (2013.01); *H01L 2924/1811* (2013.01); *H01L 2924/2064* (2013.01); *H01L 2924/381* (2013.01)

(56) References Cited

U.S. PATENT DOCUMENTS

| | | | |
|---|---|---|---|
| 2006/0038291 A1* | 2/2006 | Chung | H01L 23/3128 257/738 |
| 2006/0246703 A1* | 11/2006 | Daubenspeck | H01L 23/556 438/612 |
| 2010/0127377 A1* | 5/2010 | Bauer | B81B 7/0058 257/690 |
| 2010/0165585 A1 | 7/2010 | Lin et al. | |
| 2011/0195543 A1* | 8/2011 | Jadhav | H01L 23/49816 438/106 |
| 2012/0161324 A1 | 6/2012 | Heinrich et al. | |
| 2012/0299181 A1 | 11/2012 | Chen et al. | |
| 2013/0200470 A1 | 8/2013 | Liu et al. | |
| 2014/0117515 A1* | 5/2014 | Lachner | H01L 23/3135 257/664 |

\* cited by examiner

US 9,761,551 B2

SOLDER JOINT STRUCTURE FOR BALL GRID ARRAY IN WAFER LEVEL PACKAGE

PRIORITY CLAIM

This application claims the benefit to and is a divisional of U.S. patent application Ser. No. 14/096,953, filed on Dec. 4, 2013, and entitled "Solder Joint Structure for Ball Grid Array in Wafer Level Package," which application is incorporated herein by reference.

BACKGROUND

In the formation of wafer-level chip scale package structures, integrated circuit devices such as transistors are first formed at the surface of a semiconductor substrate in a wafer. An interconnect structure is then formed over the integrated circuit devices. A metal pad is formed over, and is electrically coupled to, the interconnect structure. A passivation layer and a first polyimide layer are formed over the metal pad, with the metal pad exposed through the openings in the passivation layer and the first polyimide layer.

A seed layer is then formed on the first polyimide layer, followed by the formation of Post-Passivation Interconnect (PPI) lines and pads. The PPI lines and pads may be formed by forming and patterning a first photo resist on the seed layer, plating the PPI lines and pads in the openings in the first photo resist, and then removing the first photo resist. The portions of the seed layer that were previously covered by the first photo resist are removed. Next, a second polyimide layer is formed over the PPI lines and pads, and an Under-Bump Metallurgy (UBM) is formed extending into an opening in the second polyimide layer. The UBM is electrically connected to the PPI lines and pads. The UBM is used to form a solder joint with a package substrate.

The formation of the UBM also involves forming a UBM seed layer, forming and patterning a second photo resist, forming the UBM on the UBM seed layer, removing the second photo resist, and removing the portions of the UBM seed layer that were previously covered by the second photo resist.

In the above-discussed process steps, two photo resists are formed and removed, and two seed layers are formed and partially removed. The manufacturing cost is thus high. Improved methods and structures for wafer-level package continue to be sought.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
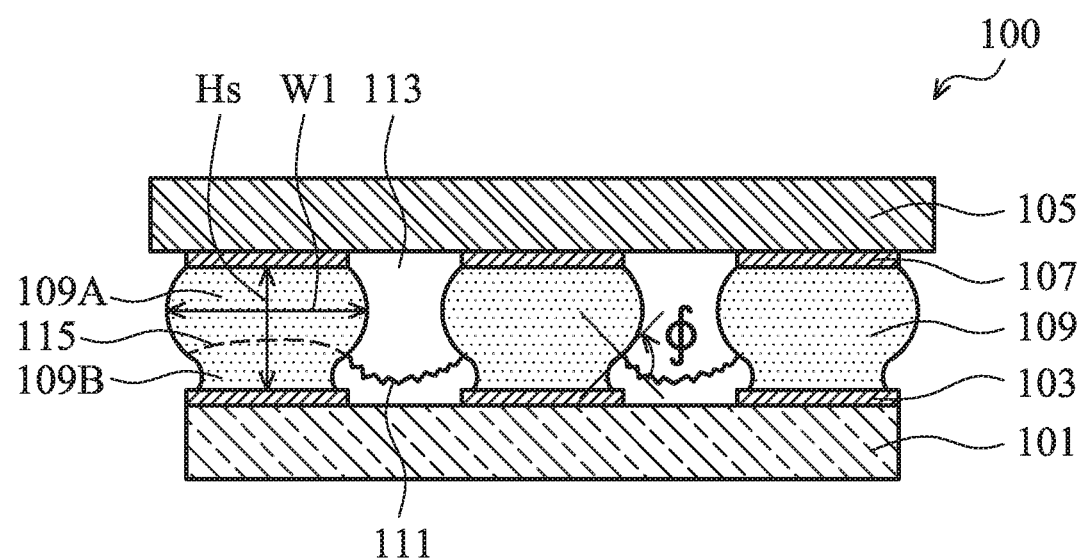
FIG. 1 is a cross-sectional diagram of a package in accordance with various embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and the methods of forming the same are provided in accordance with various embodiments of the present disclosure. Cross-sectional diagrams of workpieces in various intermediate stages of manufacturing the package in accordance with various embodiments are shown. The variations of the embodiments are also discussed. Throughout the various views and embodiments, like reference numbers are used to designate like elements.

A molding compound is applied on the workpiece as a viscous liquid. The workpiece includes semiconductor devices, interconnect structure, passivation layer, post-passivation interconnect (PPI), and an intermediate solder joint on the PPI. The intermediate solder joint is formed by reflowing conductive balls, i.e., solder balls, placed on the PPI. Generally, the conductive ball is a solid sphere, and the intermediate solder joint has a flat side where it is bonded to the PPI. The rest of the intermediate solder joint has a hemispherical shape defined by surface tension during the reflow process. Thus, the height of the conductive ball is higher than that of the intermediate solder joint. The liquid molding compound is molded by pressing a release film over the liquid molding compound and the workpiece. The release film can deform over the intermediate solder joint to form a horizontal molding compound, with some curvature between conductive balls. The properties of the release film and the size of the intermediate solder joint determine the thickness of the resulting molding compound. According to various embodiments, the release film can be used to form relatively thick, or high molding compound layer, for example, between about 110 to 135 microns for a 250-micron conductive ball. A release film that can form a thinner, or shorter molding compound layer, for the same sized conductive ball is not available. The release film has a thickness greater than 100 microns, and may be about 150 microns, or greater. The portion of the release film over the intermediate solder joint must deform so as to not mechanically stress the intermediate solder joint against the PPI, yet portions of the release film not over the intermediate solder joint must press down on the liquid molding compound between adjacent intermediate solder joints. The liquid molding compound may be cured to form the molding compound.

The use of molding compound around an intermediate solder joint can strengthen the intermediate solder joint on the PPI so that the subsequent bonding process with the package substrate would not dislodge the intermediate solder joint from the PPI. During the subsequent bonding process, a package substrate having conductive pads thereon is aligned and pressed against the workpiece in an elevated temperature environment. The intermediate solder joint reflows and bonds to the conductive pad in the package substrate. The surface area of the intermediate solder joint available to form the solder joint is limited to the portion not encapsulated by the molding compound. The resulting solder joint often has a distinctive top portion and bottom portion. The top portion participates in the reflow and joins to the conductive pad on the package substrate. The bottom portion is encapsulated by the molding compound. A waist is observed between the top portion and the bottom portion. The waist may not have a smooth transition between the top portion and the bottom portion and can be a weak point susceptible to mechanical defects. In many cases, the waist is a cusp ring of the top portion and bottom portion of the solder joint. In some cases, the waist resembles a narrow section of a hyperboloid of one sheet.

FIG. 1 is a cross-sectional diagram of a package 100 having a smooth transition between a top portion and a bottom portion of the solder joint without the aforementioned waist weak point. The package 100 includes a semiconductor chip 101 having a post-passivation interconnect (PPI) pads 103 thereon. In certain embodiments, the PPI pads 103 may include under-bump metallurgy (UBM). A package substrate 105, which may be a printed circuit board (PCB), has bonding pads 107 thereon. A solder joint 109 is disposed between the package substrate 105 and the semiconductor chip 101 and provides electrical conduction between the bonding pad 107 and PPI pad 103. The solder joint 109 has a height Hs and is surrounded by a molding compound 111 in a lower portion. The solder joint 109 can be defined by two portions 109A and 109B. A top portion 109A is not contacted by the molding compound 111. A bottom portion 109B is surrounded by molding compound 111 at its sidewalls. In some embodiments, an underfill material 113, usually a polymer, is disposed between the solder joints 109, the molding compound 111, the package substrate 105, and the semiconductor chip 101.

A surface of the molding compound forms an angle φ with a sidewall of the top portion 109A of the solder joint 109. The angle φ is 90 degrees or less, for example, between about 30 degrees and about 80 degrees. The top portion 109A has a larger height than the bottom portion 109B. In other words, more than 50% of the solder joint height Hs is the top portion. In some embodiments, the top portion has a height greater than 100 microns and the bottom portion has a height less than about 100 microns. The sidewall profile of the solder joint 109 is a smooth curve with no singularity, or cusp. At the transition between the top portion 109A and 198B, the sidewall profile has no sharp indentation. In some embodiments, the transition line, or a top of the bottom portion, is vertically 10 microns or less from a line of the widest part of the solder joint 109. In other words, the line W1 indicating the widest part of the solder joint is less than 10 microns above line 115 indicating the transition between the bottom portion and the top portion. As shown in FIG. 1, the top portion 109A is generally wider than the bottom portion 109B. In some embodiments, smallest diameter in the top portion 109A of the solder joint is same or larger than a largest width in the bottom portion 109B.

The surface of the molding compound has a roughness (Ra) greater than about 2 microns, for example, about 3 microns. Ra is the arithmetic mean of the absolute departures of a roughness profile from the mean line of the measurement. The surface roughness is greater than that attainable through the release film molding process. The greater surface roughness results from plasma etching of the molding compound after forming and increases adhesion to the underfill material. Plasma etching of the molding compound after forming reduces the thickness of the molding compound as well as increases the surface roughness of the molding compound. The reduction in molding compound thickness changes the height ratio between the top portion and the bottom portion. Even though this additional process step increases costs, by increasing the height of the top portion, more surface of the intermediate solder joint is available for the reflow bonding with the conductive pad on the package substrate and the interface between the top portion and the bottom portion is a smooth curve.

In one example, the solder joints have a pitch of about 400 microns when the solder joint is formed from a conductive ball of about 250 microns in diameter. A distance between adjacent solder joints across a widest part of the solder joint is about 150 microns. A height of the molding compound at about midway between solder joints is about 100 microns. The structure of FIG. 1 is found to have good reliability in thermal cycling simulations. Under a thermal cycling test of −40 degrees Celsius to 125 degrees Celsius, a Weibull prediction of 63% failure rate at the corner solder joint of a package is greater than 1000 cycles.

Figure 2:
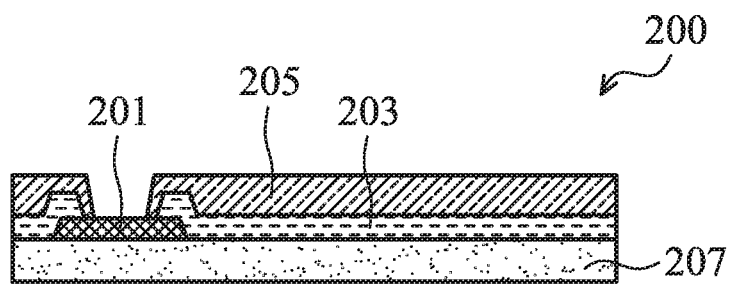
FIGS. 2 through 12 are cross-sectional diagrams of intermediate stages in the manufacturing of a chip, and the bonding of the chip, in accordance with various embodiments.

The process for making the structure of FIG. 1 is discussed in association with FIGS. 2 to 12 according to various embodiments of the present disclosure. In FIG. 2, a partially fabricated semiconductor chip 200 having a metal pad 201 on a substrate 207, passivation layer 203, and a polymer layer 205 over the passivation layer 203 is provided. The substrate 207 is a semiconductor substrate, such as a silicon substrate, although it may be formed of other semiconductor materials such as silicon germanium, silicon carbon, gallium arsenide, or the like. The substrate 207 includes semiconductor devices, which include transistors, and interconnect structures electrically coupled to semiconductor devices. Interconnect structures include metal lines and vias formed therein. The metal lines and vias may be formed of copper or copper alloys, and may be formed using damascene processes. Interconnect structure may include an inter-layer dielectric (ILD) and inter-metal dielectrics (IMDs), which may comprise low-k dielectric materials. In alternative embodiments, substrate 207 is an interposer wafer or a package substrate, and is substantially free from integrated circuit devices including transistors, resistors, capacitors, inductors, and/or the like, formed therein.

FIG. 2 shows only a portion of the cross-section of the substrate 207. The substrate 207 may be a wafer including many repeating areas having the semiconductor devices and interconnect structures. Each of the repeating areas may be separated to form an individual semiconductor chip. According to various embodiments, the process described herein generally refers to processes performed on the entire wafer before singulation. However, the processes also apply to semiconductor chips that are already separated individually from a wafer.

Metal pad 201 is formed over interconnect structure. Metal pad 201 may include aluminum (Al), copper (Cu), silver (Ag), gold (Au), nickel (Ni), tungsten (W), alloys thereof, and/or multi-layers thereof. Metal pad 201 is electrically coupled to underlying semiconductor devices through the interconnect structures beneath the metal pad 210. Passivation layer 203 may be formed to cover edge portions of metal pad 201. In some embodiments, passivation layer 203 is formed of a silicon oxide layer and a silicon nitride layer over the silicon oxide layer, although other dielectric materials may be used. An opening is formed in passivation layer 203. A polymer 205 is deposited over the passivation layer 203. In some embodiments, polymer layer 205 is a polyimide layer. Openings in the passivation layer 203 and polymer layer 205 exposes a portion of the metal pad 201.

Figure 3:
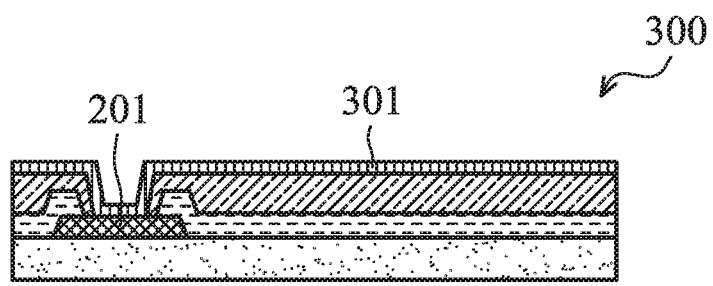

In FIG. 3, a metal seed layer 301 is deposited over the partially fabricated semiconductor chip 200, including on the exposed portion of the metal pad 201 to form partially fabricated semiconductor chip 300. Metal seed layer 301 may include one or more layers. A first layer may be a titanium layer, a titanium nitride layer, a tantalum layer, a tantalum nitride layer, or the like. A second layer may include copper or copper alloys. In some embodiments, metal seed layer 301 is formed using physical vapor deposition (PVD), although other applicable methods may also be used.

Figure 4:
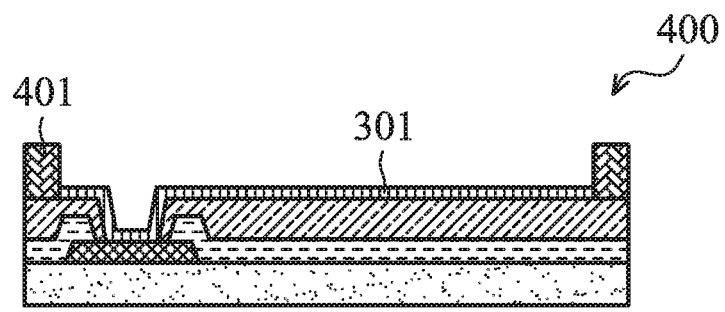
Figure 5:
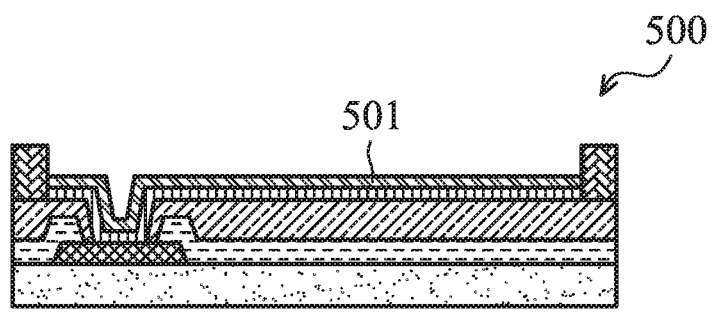

In FIG. 4, a mask 401 is formed on the partially fabricated semiconductor chip 300 to form partially fabricated semiconductor chip 400. In some embodiments, mask 401 is formed of a photo resist, and hence is alternatively referred to as photo resist 401 throughout the description, although other materials such as dry films may be used. A photoresist is coated onto the partially fabricated semiconductor chip, exposed to patterned light, developed, and cured to form openings. A portion of seed layer 301 is exposed through opening in mask 401. Next in FIG. 5, showing a partially fabricated semiconductor chip 500, a plating step is performed to form Post-Passivation Interconnect (PPI) 501 in the mask opening. PPI 501 may be formed of copper or copper alloys.

Figure 6:
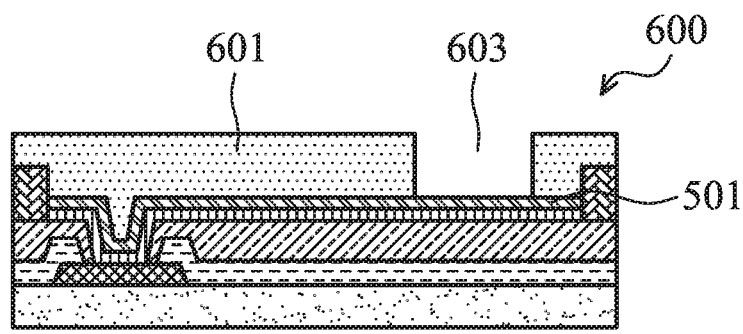

FIG. 6 is a cross-sectional diagram of a partially fabricated semiconductor chip 600 having a second mask 601 forming a smaller opening 603 within the opening from mask 401 of FIG. 4. A photoresist is coated onto the partially fabricated semiconductor chip, exposed to patterned light, developed, and cured to form opening 603 that exposes a portion of the PPI 501.

Figure 7:
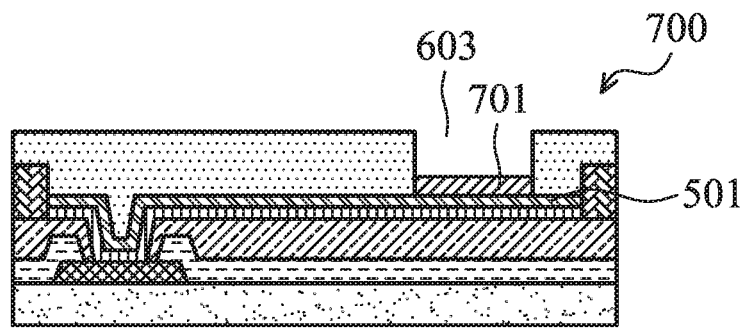

FIG. 7 is a cross-sectional diagram of a partially fabricated semiconductor chip 700 having a PPI pad 701 in the opening 603. The PPI pad 701 contacts the PPI 501 in the opening 603. In some embodiments, the PPI pad 701 is electroplated in the opening 603. The electroplating is selective because only conductive surfaces at the bottom of the opening 603 would be deposited. The PPI pad 701 may include nickel, palladium, titanium, tantalum, combinations thereof, and/or multi-layers thereof.

Figure 8:
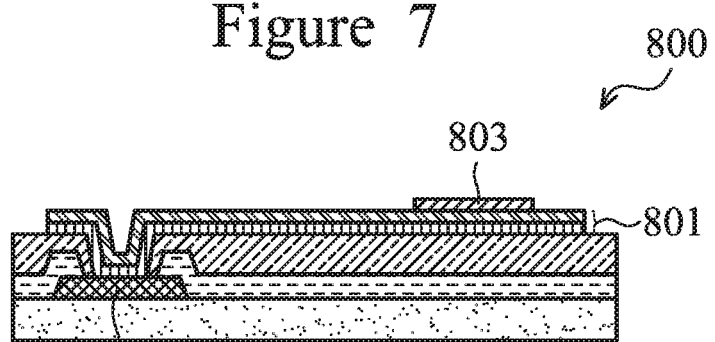

FIG. 8 is a cross-sectional diagram of a partially fabricated semiconductor chip 800 having PPI line 801 and PPI pad 803 connected to metal pad 201. The partially fabricated semiconductor chip 800 is formed by removing the masks 601 and 401, and maskless etching. The etching removes a portion of the metal seed layer not protected by the PPI 501 and reduces a thickness of the PPI pad 803 and PPI 501. A PPI line 801 having a metal seed layer and bulk metal layer is thus patterned. Depending on the design of the product, generally each PPI 803 and PPI line 801 connect to one metal pad 201.

Figure 9:
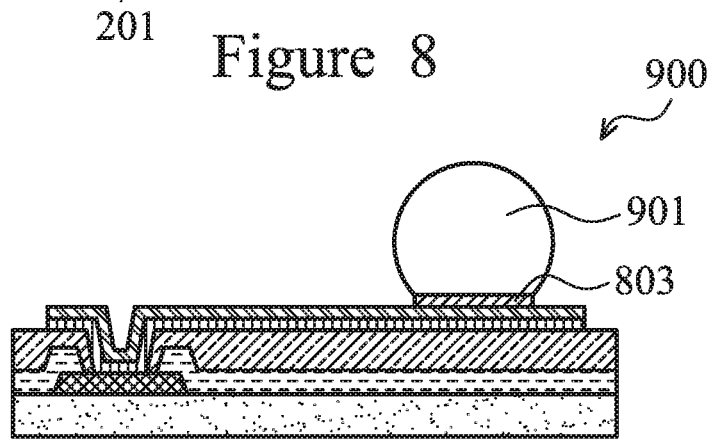

FIG. 9 is a cross-sectional diagram of a partially fabricated semiconductor chip 900 having an intermediate solder joint 901 on the PPI pad 803. The partially fabricated semiconductor chip 900 is formed by placing a conductive ball, i.e., a solder ball, on the PPI pad 803 and then increasing the temperature to cause the conductive ball to flow. The solder ball may comprise Sn—Ag, Sn—Ag—Cu, or the like, and may be lead-free or lead-containing. The interface between the conductive ball and the PPI pad 803 wets and changes the shape of the conductive ball slightly to form the intermediate solder joint 901. As shown in FIG. 9, the intermediate solder joint 901 has a partial-spherical top and a flat bottom. The partial-spherical top is formed by surface tension during the solder flow. When the solder ball melts and bonds with the PPI pad 803, its shape changes. The intermediate solder joint 901 has a smaller height as compared to the conductive ball before bonding. Thus, the shape of the intermediate solder joint 901 depends on the size of the conductive ball and size of the PPI pad. A larger PPI pad would cause the intermediate solder joint to be much shorter than the conductive ball. However, the PPI pad is designed to be large enough to form a bond that can withstand mechanical stresses of subsequent processes and maintain good conductivity. According to various embodiments, the PPI pad is at least about 30% of the conductive ball diameter, but not greater than the conductive ball diameter. In some embodiments, the PPI pad may be between about 30% and 80% of the conductive ball diameter. In some embodiments, the intermediate solder joint height may be between about 80% to 95% of the conductive ball height.

Figure 10:
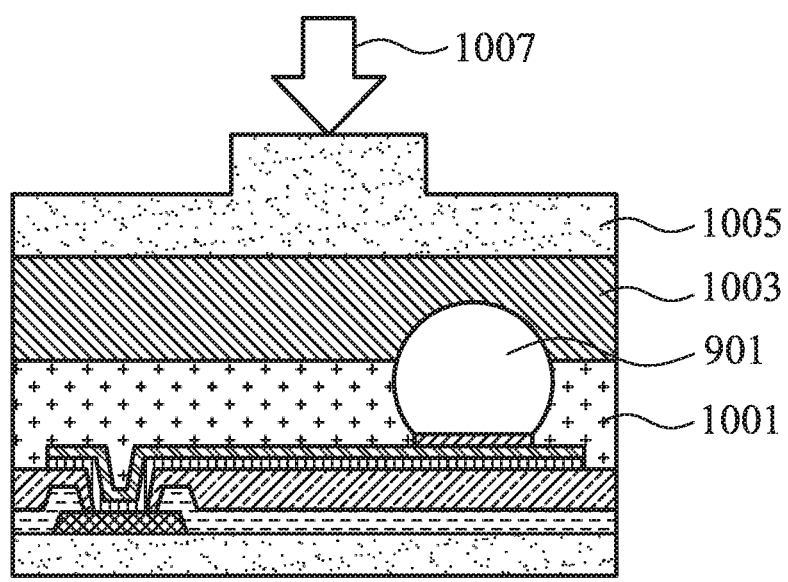

Next, as shown in FIG. 10, polymer layer 1001 is applied using a release film molding process. The polymer layer 1001 may be a liquid molding compound, which is so named because it has a lower viscosity than some other molding compounds at the time it is dispensed. In the cross-sectional diagram of a FIG. 10, the liquid molding compound is deposited and a pressure 1007 applied through a release film 1003 by a molding apparatus 1005. The release film 1003 deforms around the intermediate solder joint 901. The initial thickness of the liquid molding compound 1001 depends on the properties of the release film 1003. The initial thickness of the liquid molding compound 1001 may be half of the intermediate solder joint height and may have different thicknesses away from the intermediate solder joint (between intermediate solder joints) and adjacent to the intermediate solder joint. The liquid molding compound may be cured to form a solid molding compound with the release film and optionally the molding apparatus in place.

Figure 11:
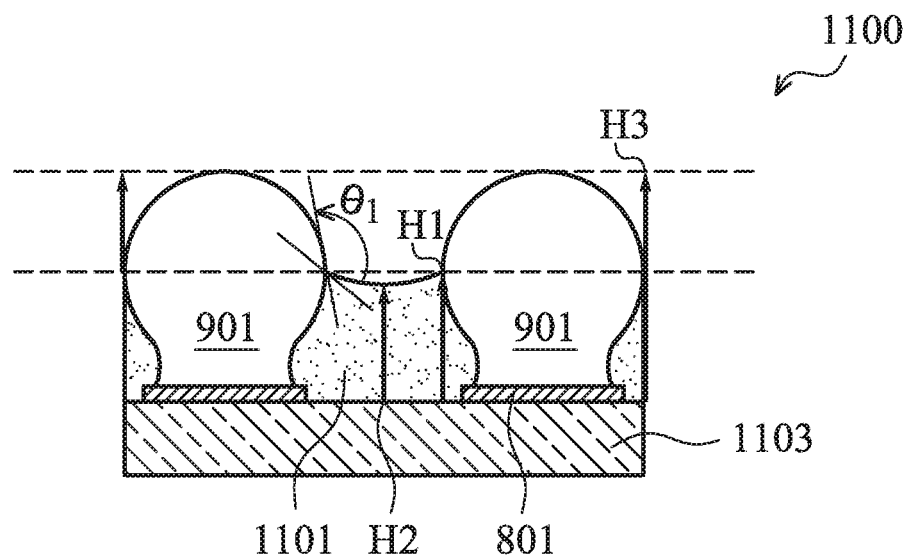

FIG. 11 is a cross-sectional diagram of a partially fabricated semiconductor chip 1100 after a release film is removed. The partially fabricated semiconductor chip 1101 includes a substrate 1103 that includes all features under the PPI pad 801. The various features under the PPI pad 801 shown in FIGS. 2 through 10 are not shown. Intermediate solder joints 901 are disposed on and bonded to the PPI pads 801. The intermediate solder joints 901 has a height H3. A molding compound 1101 surrounds a bottom portion of the intermediate solder joints 901. The molding compound 1101 has a height from H2 to H1. The molding compound 1101 height is smallest at about a midway point between the intermediate solder joints 901 and largest at the intermediate solder joint surface. A surface of the molding compound 1101 forms an angle $\theta_1$ with a sidewall of the top portion of the intermediate solder joint 901, as shown. According to various embodiments, the angle $\theta_1$ is between about 110 and 150 degrees. A difference in height H3 to H1, in other words, the height of the top portion of the intermediate solder joint, is less than about ½ of H3. Because the exposed portion of the intermediate solder joint is used to bond with a package substrate, the height of the top portion contributes to the quality of the bond. The molding compound surface has a smooth surface having a roughness parameter of between about 1 and 2 microns.

In some embodiments, the conductive ball used to form the intermediate solder joint is about 250 microns. With a PPI pad of 200 microns, the intermediate solder joint has a height H3 between about 220 and 240 microns. With a pitch of about 400 microns, the difference in H1 and H2 is between about 20 to 30 microns. In one example, H1 is about 135 microns and H2 is about 110 microns. An average height of the molding compound may be between about 115 microns to about 130 microns.

These dimensions are merely examples given a conductive ball size, pad size, and pitch. When smaller conductive balls are used and the pitch is different, these dimensions would also change. As discussed, the release film material limits the height of the molding compound because the release film deform around the intermediate solder joint. So while a H1 and H2 may be increased, they cannot be easily decreased given the use of release film and the geometry involved.

According to various embodiments of the present disclosure, the molding compound is etched to reduce its height. The etch reduces the molding compound height and increases its surface roughness. A plasma etch process may be used. The plasma etch process may be maskless and include etchants that preferentially remove the molding compound material over the material of the intermediate solder joint. In some embodiments, the plasma etch uses fluorine-containing plasma in a process combining reactive ion etch and physical bombardment. In one example, the plasma etch is performed at a temperature of about 70 degrees and includes $CF_4$, $O_2$, and $N_2$ gas. The amount etched is directly correlated to process time. So the remaining molding compound depth after etching may be controlled by controlling the duration of the etch. In some embodiments, the etch is performed for between about 100 second and about 400 seconds. According to various embodiments, the etch conditions may be tuned to make the molding compound height more uniform, for example, by changing the power ratio between radiofrequency (RF) power and the microwave power to change the amount of reactive ion etching (isotropic) versus physical bombardment (anisotropic). Between about 10% to 80% of the molding compound may be removed. In some instances, the resulting molding compound may be between about 10% to about 40% of the conductive ball height. The surface of the molding compound after etching is more rough as compared to after removing the release film. In various embodiments, the roughness parameter (Ra) becomes between about 3 microns to about 6 microns. In one example, the roughness parameter is about 3.5 microns. The increased roughness improves adhesion to subsequent materials deposited over the molding compound.

Figure 12:
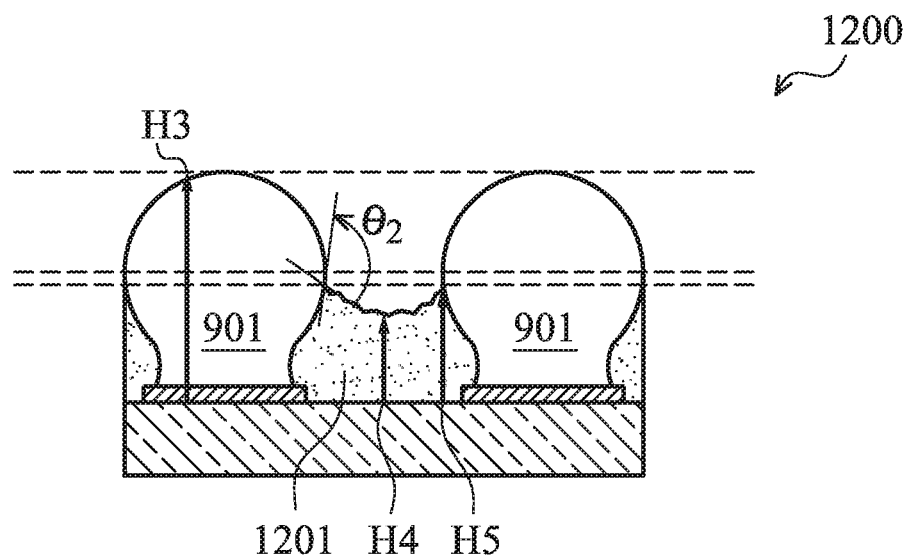

FIG. 12 is a cross-sectional diagram of a partially fabricated semiconductor chip 1200 including a thinned molding compound 1201 having heights H4 to H5. Heights H4 to H5 are less than H2 and H1. The etching process does not substantially reduce the height of the intermediate solder joints 901 of FIG. 12. An angle $\theta_2$ formed between a surface of the molding compound 1201 and a sidewall of a top portion of the intermediate solder joint 901 is between about 50 and 105 degrees, for example, about 90 degrees. The height H4 may be between about 30 microns and 100 microns. The height H5 is between about 20 microns and 25 microns larger than the height H4, and may be between about 50 microns and 125 microns. An average height of the thinned molding compound may be between about 85 microns to about 100 microns.

The reduced height of the molding compound increases the surface area in a top portion of the intermediate solder joint that is available to bond to a bonding pad on a package substrate than is previously achievable using a release film to form the molding compound without plasma etching. The increased surface area increases the process window in the subsequent surface-mount technology (SMT) bonding process. The etch process also cleans the top portion of the intermediate solder joint to improve the bond quality without an additional cleaning step.

A package substrate having bonding pads thereon is then bonded to the partially fabricated semiconductor chip by an SMT bonding process. The package substrate is aligned with the partially fabricated semiconductor chip and contacts the intermediate solder joints. The temperature is elevated to cause the intermediate solder joint to reflow to form the package of FIG. 1. During the reflow, a top portion of the intermediate solder joint wets the bonding pad on the package substrate to form the solder joint 109 of FIG. 1. During the reflow, the remaining molding compound encapsulates a bottom portion of the intermediate solder joint and protects the bond with the PPI pad.

After the SMT bonding, an underfill material may be added to strengthen the solder joint. The underfill may be flowed to the areas between the solder joints and the molding compound and cured to solidify. An entire wafer of partially fabricated semiconductor chip may be bonded with an equally sized package substrate in a wafer-level process. The packaged wafer may then be sawed one or more times to singulate the packaged wafer into individual packaged final products.

In accordance with embodiments, a method includes forming an electrical connector over a substrate of a wafer, and molding a polymer layer, with at least a portion of the electrical connector molded in the polymer layer. A first sawing step is performed to form a trench in the polymer layer. After the first sawing step, a second sawing step is performed to saw the wafer into a plurality of dies.

In accordance with various embodiments, one aspect of the present disclosure pertains to a package. The package includes a package substrate, a semiconductor chip, an array of solder joints between the package substrate and the semiconductor chip, each solder joints having a bottom portion proximate to the semiconductor chip and a top portion proximate to the package substrate, and a molding compound surrounding the bottom portion of the solder joints. A top portion of the solder joint has a larger height than the bottom portion. The top portion of the solder joint may perform an angle of less than about 90 degrees, or between about 30 degrees and about 80 degrees, with a top surface of the molding compound. In some embodiments, a smallest diameter in the top portion of the solder joints is same or larger than a largest width in the bottom portion. The top portion may have a height greater than about 100 microns and the bottom portion may have a height less than about 100 microns. In some embodiments, a height of the maximum solder joint diameter is 10 microns or less from a top of the bottom portion. The molding compound may have a roughness at about 3 microns, or more.

In accordance with various embodiments, another aspect of the present disclosure pertains to a method. The method includes providing a partially fabricated semiconductor chip having post passivation interconnect (PPI) thereon, placing conductive balls on the PPI, heating the partially fabricated semiconductor chip to reflow the conductive balls into intermediate solder joints, depositing a molding compound around the intermediate solder joints to a first height using a release film, and plasma etching the molding compound to a second height. The method may also include providing a printed circuit board (PCB) having conductive pads thereon, contacting the conductive pads of the PCB to the intermediate solder joints of the semiconductor chip, and heating the PCB and the semiconductor chip to reflow the intermediate solder joints into solder joints. The solder joint height may be 85% or less of the conductive ball height. The plasma etching may include etching with a fluorine-containing plasma and may be performed for a duration between about 100 to 400 seconds. The plasma etching may remove between about 15 microns to 50 microns of the molding compound.

In one aspect, embodiments described herein may provide for a package comprising a package substrate and a semiconductor chip. An array of solder joints extend between the package substrate and the semiconductor chip, each solder joint having a bottom portion proximate to the semiconductor chip and a top portion proximate to the package substrate. A molding compound surrounds the bottom portion, but not the top portion, of the solder joints, the molding compound having curvilinear surfaces extending between the respective ones of the solder joints. The top portion has a larger height than the bottom portion.

In another aspect embodiments described herein may provide for a package comprising a semiconductor chip having a plurality of contact pads on a surface thereof and a substrate positioned opposed to the semiconductor chip and having a plurality of bonding pads on a surface thereof. The package also includes a plurality of solder joints bonding respective ones of the plurality of contact pads to respective ones of the plurality of bonding pads, and a molding compound encapsulating lower portions of the plurality of solder joints and extending between respective ones of the plurality of solder joints. The molding compound has a topmost surface having curvilinear surfaces extending between the respective ones of the solder joints.

In yet another aspect, embodiments described herein may provide for a package comprising an array of solder joints bonding a plurality of contact points on a first package component to corresponding contact points on a second package component. The package also includes a molding compound surrounding lower portions of the array of solder joints, the topmost surface of the molding compound forming a catenary shape between adjacent ones of the array of solder joints.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    a package substrate;
    a semiconductor chip;
    an array of solder joints between the package substrate and the semiconductor chip, each solder joint having a bottom portion proximate to the semiconductor chip and a top portion proximate to the package substrate, wherein the bottom portion has a concave sidewall, and wherein the top portion has a convex sidewall; and
    a molding compound surrounding the bottom portion, but not the top portion, of each solder joint, the molding compound contacting the concave sidewall of the bottom portion, the molding compound having curvilinear surfaces extending between respective ones of the array of solder joints,
    wherein the top portion has a larger height than the bottom portion.

2. The package of claim 1 wherein the top portion of the solder joints form an angle of 90 degrees or less with a top surface of the molding compound.

3. The package of claim 1, wherein the top portion of the solder joints form an angle between about 30 degrees to about 80 degrees with a top surface of the molding compound.

4. The package of claim 1, wherein a smallest diameter in the top portion of the solder joints has been same or larger than a largest width in the bottom portion.

5. The package of claim 1, wherein the top portion has a height greater than 100 microns.

6. The package of claim 1, wherein the bottom portion has a height less than about 100 microns.

7. The package of claim 1, wherein a height of the maximum solder joint diameter has been 10 microns or less from a top of the bottom portion.

8. The package of claim 1, wherein a top surface of molding compound has a roughness of greater than about 2 microns.

9. The package of claim 8, wherein the roughness has been about 3 microns.

10. The package of claim 1, wherein a distance between adjacent solder joints across a top of the molding compound has been greater than about 200 microns and a pitch between solder joints has been about 400 microns.

11. The package of claim 1, further comprising an underfill material filling a space between a top of the molding compound and a bottom of the package substrate.

12. A package comprising:
    a semiconductor chip having a plurality of contact pads on a surface thereof;
    a substrate positioned opposed to the semiconductor chip and having a plurality of bonding pads on a surface thereof;
    a plurality of solder joints bonding respective ones of the plurality of contact pads to respective ones of the plurality of bonding pads; and
    a molding compound encapsulating lower portions of the plurality of solder joints and extending between respective ones of the plurality of solder joints, wherein upper portions of the plurality of solder joints are not surrounded by the molding compound, wherein the molding compound has a topmost surface having curvilinear surfaces extending between the respective ones of the plurality of solder joints, wherein sidewalls of the upper portions of the plurality of solder joints have first curvatures, wherein sidewalls of the lower portions of the plurality of solder joints have second curvatures, wherein the molding compound contacts the sidewalls of the lower portions of the plurality of solder joints, and wherein the first curvatures and the second curvatures have opposite signs.

13. The package of claim 12, wherein a maximum thickness of the molding compound is less than half a height of at least one of the plurality of solder joints.

14. The package of claim 12, further comprising an underfill material extending from the topmost surface of the molding compound to the surface of the substrate.

15. The package of claim 12, wherein the topmost surface of the molding compound forms an angle with respective ones of the solder joints, the angle being 90 degrees or less.

16. The package of claim 12, wherein the topmost surface of the molding compound forms an angle with respective ones of the solder joints, the angle being about 30 degrees to about 80 degrees.

17. The package of claim 12, wherein the topmost surface of the molding compound has a roughness between about 3 microns and about 6 microns.

18. A package comprising:
- an array of solder joints bonding a plurality of contact pads on a first package component to corresponding contact pads on a second package component, each of the array of solder joints being in physical contact with a respective one of the plurality of contact pads on the first package component, a bottommost surface of each of the array of solder joints being above a topmost surface of a respective one of the plurality of contact pads on the first package component; and
- a molding compound surrounding lower portions of the array of solder joints, a topmost surface of the molding compound forming a catenary shape between adjacent ones of the array of solder joints, wherein the topmost surface of the molding compound has a roughness of about 3 microns.

19. The package of claim 18, wherein the molding compound surrounds respective portions of respective solder joints having concave sidewalls and the molding compound does not surround respective portions of respective solder joints having convex sidewalls.

20. The package of claim 19, wherein the molding compound physically contacts the concave sidewalls.

* * * * *